United States Patent
Hall et al.

(10) Patent No.: US 11,443,802 B2
(45) Date of Patent: Sep. 13, 2022

(54) ADAPTIVE MEMORY MANAGEMENT AND CONTROL CIRCUITRY

(71) Applicant: NUMEM Inc., Sunnyvale, CA (US)

(72) Inventors: Eric Hall, Mount Vernon, WA (US); Doug Smith, Mesa, AZ (US); Nicholas T. Hendrickson, Burnsville, MN (US); Jack Guedj, Los Altos Hills, CA (US)

(73) Assignee: NUMEM INC., Sunnyvale, CA (US)

( * ) Notice: Subject to any disclaimer, the term of this patent is extended or adjusted under 35 U.S.C. 154(b) by 0 days.

(21) Appl. No.: 16/924,958

(22) Filed: Jul. 9, 2020

(65) Prior Publication Data
US 2022/0013169 A1  Jan. 13, 2022

(51) Int. Cl.
G11C 11/00 (2006.01)
G11C 13/00 (2006.01)

(52) U.S. Cl.
CPC ........ G11C 13/004 (2013.01); G11C 13/0069 (2013.01)

(58) Field of Classification Search
CPC .......................... G11C 13/004; G11C 3/0069
USPC ........................................................ 365/148
See application file for complete search history.

(56) References Cited

U.S. PATENT DOCUMENTS

| 8,127,153 | B2 | 2/2012 | Kapil |
| 10,664,183 | B1 | 5/2020 | Weaver et al. |
| 2003/0229821 | A1 | 12/2003 | Ma |
| 2005/0125702 | A1 | 6/2005 | Huang et al. |
| 2010/0017042 | A1 | 1/2010 | Lopata |
| 2014/0006818 | A1 | 1/2014 | Doshi et al. |
| 2014/0208144 | A1 | 7/2014 | Ma |
| 2018/0314236 | A1 | 11/2018 | Kimura et al. |
| 2019/0179685 | A1 | 6/2019 | Ki |
| 2019/0221260 | A1* | 7/2019 | Wang .................... G11C 13/003 |
| 2020/0027508 | A1 | 1/2020 | Li et al. |
| 2020/0151054 | A1* | 5/2020 | Shin ....................... G06F 3/0679 |
| 2021/0082488 | A1 | 3/2021 | Mahatme et al. |
| 2021/0325956 | A1 | 10/2021 | Adsure et al. |

OTHER PUBLICATIONS

International Search Report and Written Opinion, PCT Application No. PCT/US21/40909, dated Nov. 22, 2021, 10 pages, USPTO.
Non-Final Office Action, U.S. Appl. No. 16/924,948, dated Dec. 10, 2021, 15 pages, USPTO.
Restriction Requirement, U.S. Appl. No. 16/924,948, dated Jun. 18, 2021, 7 pages, USPTO.
VLSI Universe, MBIST (Memory Built-In Self Test), May 2013, 6 pages, Retrieved from the Internet on Nov. 17, 2021 at URL: vlsiuniverse.blogspot.com/2013/05/mbist.html.
Notice of Allowance, U.S. Appl. No. 16/924,948, dated May 6, 2022, 12 pages, USPTO.
Corrected Notice of Allowance, U.S. Appl. No. 16/924,948, dated Jul. 5, 2022, 6 pages, USPTO.

* cited by examiner

*Primary Examiner* — Vu A Le
(74) *Attorney, Agent, or Firm* — Jaffery Watson Mendonsa & Hamilton LLP

(57) ABSTRACT

An adaptive memory management and control circuitry (AMMC) to provide extended test, performance, and power optimizing capabilities for a resistive memory is disclosed herein. In one embodiment, a resistive memory comprises a resistive memory array and an Adaptive Memory Management and Control circuitry (AMMC) that is coupled to the resistive memory array. The AMMC is configured with extended test, reliability, performance and power optimizing capabilities for the resistive memory.

14 Claims, 11 Drawing Sheets

ADAPTIVE MEMORY MANAGEMENT AND CONTROL CIRCUITRY

TECHNICAL FIELD

The present disclosure relates generally to memory arrays, and more specifically to Adaptive Memory Management and Control circuitry (AMMC) to provide extended test, performance and power optimizing capabilities for a resistive memory.

BACKGROUND

Magnetic random access memory (MRAM) devices are being developed as an alternative to conventional semiconductor memory devices for many applications including, Internet of Things (IoT), Artificial Intelligence (AI), Consumer to Server information storage, wireless and wireline communications including mobile phones, and/or information processing including microprocessors. Embedded MRAM devices provide persistent (non-volatile) storage with relatively higher densities than traditional Static Random Access Memory SRAM.

Modern portable electronic devices for IoT, wearable markets, and artificial intelligence (AI) have power consumption issues limiting battery life or impacting thermal power dissipation. Having to access memory off chip can result in 30-60× higher power consumption than accessing on-chip memory. A central processing unit (CPU) in a system on chip (SoC) is one of the highest power consuming components in electronic devices. Anytime a CPU is powered ON, power goes from a few micro amperes to a few hundreds of micro amperes and in some case a few milliamperes or even a few tens of milliamperes. Thus, the power grows by 200 to greater than 3,000× for a CPU during ON state. Frequent off chip memory accesses and CPU operating during ON state significantly increase power consumption and reduce battery life or compromise thermal power dissipation for electronic devices. Moreover, for high performance systems, going off-chip and sometimes to the main server CPU, implies latency that may impact the system efficiency and overall power dissipation.

SUMMARY

The systems, methods and devices of this disclosure each have several innovative aspects, no single one of which is solely responsible for the desirable attributes disclosed herein.

One innovative aspect of the subject matter described in this disclosure can be implemented as a systems, methods or memory circuitry having an integrated processor and logic circuitry to enable adaptive power or performance improvements and adaptive memory management and control. In one embodiment, a smart compute memory circuitry comprises an integrated processor and logic circuitry to enable adaptive power or performance improvements, and adaptive memory management and control. A resistive memory array is tightly coupled to the integrated processor for best possible area and power efficiency. Another innovative aspect of the subject matter described in this disclosure can be implemented as resistive memory that comprises a resistive memory array and an Adaptive Memory Management and Control circuitry (AMMC) that is tightly coupled to the resistive memory array. The AMMC is configured with extended test, performance, and power optimizing capabilities. The resistive memory includes an integrated processor that functions as controller for the resistive memory AMMC to provide the extended test and performance capabilities.

Details of one or more implementations of the subject matter described in this disclosure are set forth in the accompanying drawings and the description below. Other features, aspects, and advantages will become apparent from the description, the drawings and the claims. Note that the relative dimensions of the following figures may not be drawn to scale.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If the first reference label is used in the specification, the description is applicable to any one of the similar components having the same first reference label irrespective of the second reference label.

DETAILED DESCRIPTION

Figure 1:
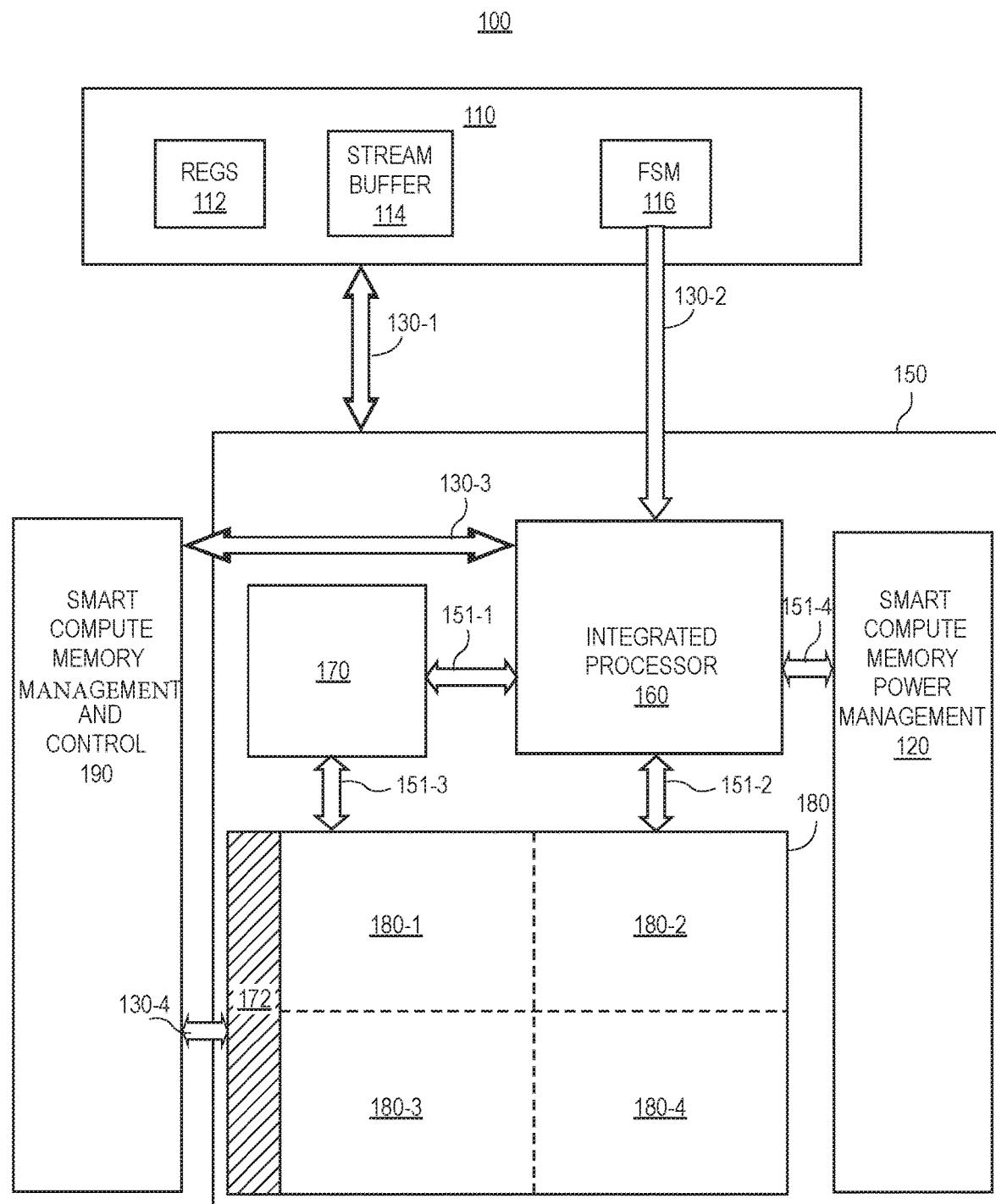
FIG. 1 depicts a block diagram of a memory subsystem 100 with smart compute memory in accordance with one embodiment.

In the following description, numerous specific details are set forth such as examples of specific components, circuits, and processes to provide a thorough understanding of the present disclosure. The term "coupled" as used herein means connected directly to or connected through one or more intervening components or circuits. Also, in the following description and for purposes of explanation, specific nomenclature is set forth to provide a thorough understanding of the present disclosure. However, it will be apparent to one skilled in the art that these specific details may not be required to practice the example implementations. In other instances, well-known circuits and devices are shown in block diagram form to avoid obscuring the present disclosure. The present disclosure is not to be construed as limited to specific examples described herein but rather to include within their scopes all implementations defined by the appended claims.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented, or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Also, "determining" may include measuring, estimating, and the like.

As used herein, the term "generating" encompasses a wide variety of actions. For example, "generating" may include calculating, causing, computing, creating, determining, processing, deriving, investigating, making, producing, providing, giving rise to, leading to, resulting in, looking up (e.g., looking up in a table, a database or another data structure), ascertaining and the like. Also, "generating" may include receiving (e.g., receiving information), accessing (e.g., accessing data in a memory) and the like. Also, "generating" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims.

Resistive RAM memory cells represent stored data as different resistance values, and are often referred to as resistance-based memory cells because the logic state of data stored therein may be determined by measuring the resistance value of the MRAM memory cell. Example resistance-based memory cells may include, but are not limited to, Magnetic RAM (MRAM) such as spin-transfer-torque (STT) memory cells, spin-orbit-torque (SOT) memory cells, resistor random access memory (ReRAM, RRAM), phase chane RAM (PCRAM), ferro-electric RAM (FeRAM) and/or carbon nanotube memory cells. By way of example, STT MRAM memory cells may store different logic states of data by changing the equivalent resistance of magnetic tunnel junction (MTJ) elements. During write operations, data may be programmed into a resistance-based memory cell by varying a current and/or a voltage driven through the memory cell, for example, to program the resistance-based memory cell to either a high impedance value or a low impedance value. During read operations, a controlled current may be driven through the resistance-based memory cell to determine an impedance value indicative of the logic state of data stored therein.

Due to the increased data collection, it is no longer practical and power efficient to move all the data to the Cloud or across Servers. Chip size and power consumption becomes dominated by memory and memory access. Increased Non-Volatile Memory is needed to store Programs, Models/Coefficients, and an increased amount of data is collected. This is the case for example for AI/Signal Processing where AI coefficients required for Deep or Convolutional Neural Networks can exceed 1 Gigabit of memory. External Memory is a possibility for these needs but memory access power dissipation is very high for external memory (e.g., 57.5 times more power dissipation for external low power double data rate (LPDDR4) RAM memory versus internal SRAM memory). However, internal memory is area limited based on a form factor of an electronic device.

More than ever, it is critical to have efficient on chip memory for ultra-low Power dissipation and thus longer Battery Life or more efficient processing/power footprint.

Frequent off chip memory accesses and intensive power consuming devices such as a CPU operating during ON state significantly increase power consumption and reduce battery life for electronic devices. Additionally, RF circuitry also consumes significant power during normal operation of the RF circuitry.

The present design includes smart compute resistive RAM to move computations and learning operations from a host system (e.g., CPU, processor, microprocessor) to smart compute resistive memory in order to reduce power consumption for different types of electronic devices. Compute inside the memory enables to conduct certain operation on the fly thereby improving both performance and overall system power. Localized processing within resistive RAM will drastically reduce overall power dissipation for electronic devices. In particular, the CPU will operate in a low power sleep mode more frequently instead of typically being in a full operational ON state.

For IoT, wearable markets and even AI, power is a key component for battery life or for overall power reduction and associated thermal issue associated with higher power. Low Latency due to not having to go to the cloud (or phone) for processing is also a key factor in many applications. Local processing in memory also enables some autonomy in case of poor network and safety for fire/emergency in which a network connection is not possible.

Also, the present design has a potential use to reduce latency and improve performance in Enterprise Storage Drives by doing some operations native to the Drive instead of sending data from the drive to the host system and then having the host system perform the operation or computation.

Smart Compute Memory can also be used to augment Memory Management and Control. Programmable memory management and control enables optimizing of memory performance versus memory endurance (e.g., longer endurance time at lower energy read/write operations causing slower performance versus higher energy (e.g., higher current/voltage) read/write operations causing faster performance and lower endurance). Programmable memory management and control manages different modes for Writing/Reading to enable more usage flexibility.

FIG. 1 depicts a block diagram of a memory subsystem 100 with smart compute memory in accordance with one embodiment. The memory subsystem 100 (e.g., AI subsystem, memory circuitry 100) includes an input/output (I/O) circuitry 110 having a primarily ON power state to manage input/output of data to the memory subsystem, smart compute memory power management circuitry 120, and smart compute memory circuitry 150 that includes an integrated processor 160 (e.g., processor, microprocessor, microcontroller, etc.), a smart compute memory management and control circuitry 190, a memory interface 170, an optional Adaptive Memory Management and Control circuitry (AMMC) 172, and a resistive memory array 180. The (I/O) circuitry 110 has the ON power state to receive external input such as streamed data.

The resistive memory array 180 can be any type of Non-volatile resistive RAM memory (e.g., magnetic RAM (MRAM) such as spin-transfer-torque (STT) memory cells, spin-orbit-torque (SOT) memory cells, resistive RAM (RRAM, ReRAM), phase-change RAM (PCRAM), Ferroelectric RAM (FeRAM), carbon nanotube memory cells, etc.) for applications ranging from non-volatile RAM to low-power, high-density SRAM. Resistive RAM is non-volatile RAM computer memory that changes a resistance across a dielectric solid-state material. The dielectric layer, which is normally insulating, can become conductive through a filament or conductive path formed from application of a sufficiently high voltage. The resistive memory array 180 has a smaller area by 2-3.5× compared to conventional RAM. In any memory application, this enables 2-3.5× more Memory On-chip to reduce off chip memory (e.g., DRAM) access for significant power savings.

This memory subsystem 100 can be a stand-alone chip or embedded as part of a larger SOC. The I/O circuitry 110 includes input stream control registers 112, a memory buffer 114 (e.g., stream FIFO buffer, queue), and a finite state machine 116 to track power states for the smart compute memory circuitry 150. Communication links 130-1, 130-2, 130-3, and 130-4 (e.g., high speed interconnects, PCIe) provide communications between the I/O circuitry 110, FSM 116, integrated processor 160, smart compute memory management and control circuitry 190, and smart compute memory circuitry 150. Interconnects connect two or more circuit elements together electrically. The integrated processor 160 can be a low power integrated processor with power-management control. The integrated processor is efficiently integrated into the memory core with integrated power management. An integrated processor could include but is not limited to custom logic functions, Digital Signal Processor, Reduced Instruction Set Computer (RISC) or Complex Instruction Set Computer (CISC) or a combination of custom logic functions and/or DSP including VLIW with RISC or CISC. The integrated processor can be used for memory computing or processing applications. The integrated processor can perform any software functions including add, subtract, compare and even Multiply. Similar to a CPU, the integrated processor can address a wide range of applications making Smart Compute Memory very flexible and adaptable to a wide range of applications.

In one example, the integrated processor initially fetches an instruction from memory (e.g., resistive memory array 180, memory 1204, memory 1206). The instruction is then decoded to determine what action is to be performed. Based on instruction the integrated processor fetches, if appropriate, data from memory or an I/O module.

The instruction is then executed which may require performing arithmetic or logical operations on the data. In addition to execution, the integrated processor also supervises and controls I/O devices (e.g., I/O circuitry 110, input device 1212). If there is any request from I/O devices, called interrupt, the integrated processor suspends execution of the current programs and transfers control to an interrupt handling program. Finally, the results of an execution may require transfer of data to the memory or an I/O Module. The integrated processor is an integrated circuit (IC). The IC is a programmable multipurpose silicon chip that is clock driven, register based, and accepts binary data as input and provides output after processing it as per the instructions stored in the memory.

The integrated processor 160 can be used to augment the memory management and control of circuitry 190 and AMMC 172. Programmable memory management and control enables optimization of memory parameters including performance (e.g., speed) versus memory endurance (e.g., longer endurance time at lower energy read/write operations causing slower performance versus higher energy (e.g., higher current/voltage) read/write operations causing faster performance and lower endurance). Additionally, the programmable memory management and control of the integrated processor 160 enables management of different modes for writing/reading to enable more usage flexibility.

The integrated processor 160 is configured to process data (e.g., pre/post process streamed data) with results of the pre/post processing being stored in the resistive memory array 180. Communication links 151-1, 151-2, 151-3, and 151-4 provide communications between the memory interface 170, integrated processor 160, power management circuitry 120, and resistive memory array 180.

In one example, streamed data from any source (e.g., computing device, server, IoT device, sensor, etc.) is stored in a buffer 114. At periodic intervals or whenever the buffer is a threshold amount full (e.g., 25% full, 50% full, 75% full, etc.), the integrated processor 160 and at least one region (e.g., 180-1, 180-2, 180-3, 180-4) of the resistive memory array 180 are awoken from a low power sleep state into an operational power state while other regions of the resistive memory array 180, a host system (e.g., a SoC main CPU 1202, processor 1227) and other components of a computing system 1200 remain in the low power sleep state. The memory subsystem 100 (e.g., memory 1204) may be integrated with computer system 1200.

In one example, the FSM 116 tracks events and a threshold amount full level of the buffer 114. Upon certain events or a threshold amount full occurring in the buffer 114, then the FSM 116 provides an indicator signal to the power management circuitry 120 to change a power state of the circuitry 150. All of the components within the circuitry 150 can have a modified power state or a subset of components can have a modified power state. If the FSM 116 determines that the integrated processor 160 has processed all or most data within the buffer, then the FSM 116 can provide another indicator signal to the power management circuitry 120 to change a power state of the circuitry 150 (e.g., reduce a power state from operational to sleep state when no data to process in the buffer).

The integrated processor 160 loads its software program from main memory 1206, preprocesses the data as required, may perform a computation, and stores the result into the resistive memory array 180. During the fully operational power state, the integrated processor 160 can read data from the buffer 114, process this data or perform computations using this data, write results from computations into the memory array 180, read these results from the memory array 180, and also receive a user query for data from the memory array 180.

Optionally, if the result of the processing of the integrated processor 160 triggers a programmed event (e.g., software applet function, threshold event), the integrated processor 160 will raise an alert (e.g., sound an alarm, send a text, wake up the main CPU, etc.). Then, the integrated processor 160 and resistive memory array 180 transition from the fully operational power state to the low power sleep state until a next event. The integrated processor 160 is tightly coupled (e.g., directly connected via a communication link) with the resistive memory array, which results in significant power savings (both active and idle power).

In one example, the memory subsystem 100 is formed or integrated on a single chip with the host system (e.g., main CPU 1202, processor 1227). This memory subsystem 100 is configurable to a wide range of input data width (x8, x16, x24, . . . ), main memory size (from small sizes to in excess of 1 Gb possible), and processing options (simple integer-only to complex floating point).

A conventional approach uses multiple chips such as an FPGA or microcontroller to do the preprocessing of the smart compute circuitry and another chip to serve as main memory. However, this approach significantly increases the power (estimated as 200× to 3,000× more power than memory subsystem 100) due to the SOC main CPU being active frequently and the data will have to be moved multiple times from chip to chip and this is very costly in terms of switching power. In addition, if the memory chip of the conventional approach is non-volatile like SRAM then it would have significantly higher idle power and the data will have to be stored on an off-chip device which would again incur 30-60× higher power consumption.

In another example of the present design, the memory subsystem 100 is a stand-alone smart compute resistive RAM memory with the integrated processor 160 being used to optimize the endurance, performance, power, and test capability of the memory. The integrated processor 160 functions as Intelligent Memory Management and Control. The input data does not need to be from a sensor device; any input source is valid.

Figure 2:
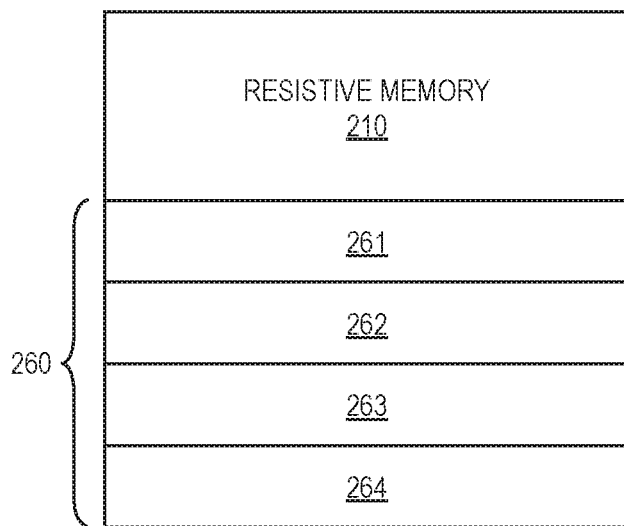
FIG. 2 depicts a functional block diagram of smart compute memory circuitry with smart compute memory in accordance with one embodiment.

FIG. 2 depicts a functional block diagram of smart compute memory circuitry with smart compute memory in accordance with one embodiment. The smart compute memory circuitry 200 (e.g., smart compute memory circuitry 150) includes a resistive memory array 210 and a smart compute circuitry 260 (or integrated processor) that functions as Intelligent Memory Management and Control.

In one example, the smart compute circuitry 260 includes compute functions that include a data path adder 261, a data path comparator 262, a reduction function 263, and control/storage registers 264. The compute functions can be pitch matched to memory input/output (e.g., I/O circuitry).

The smart compute memory circuitry 200 provides processing within the memory without waking up a host system (e.g., main CPU 1202, processor 1227) to save 10-100× in power compared to typical designs. The compute functions may include averaging, moving average, add, subtract, compare, simple multiply/divide, minimum/maximum, software applet functionality (e.g., if/then functionality), etc. If an alert is determined by the circuitry 200, then a wakeup signal can be sent to the main CPU. Design automation software customizes memory size, performance, logic functions, and data type precision.

Figure 3:
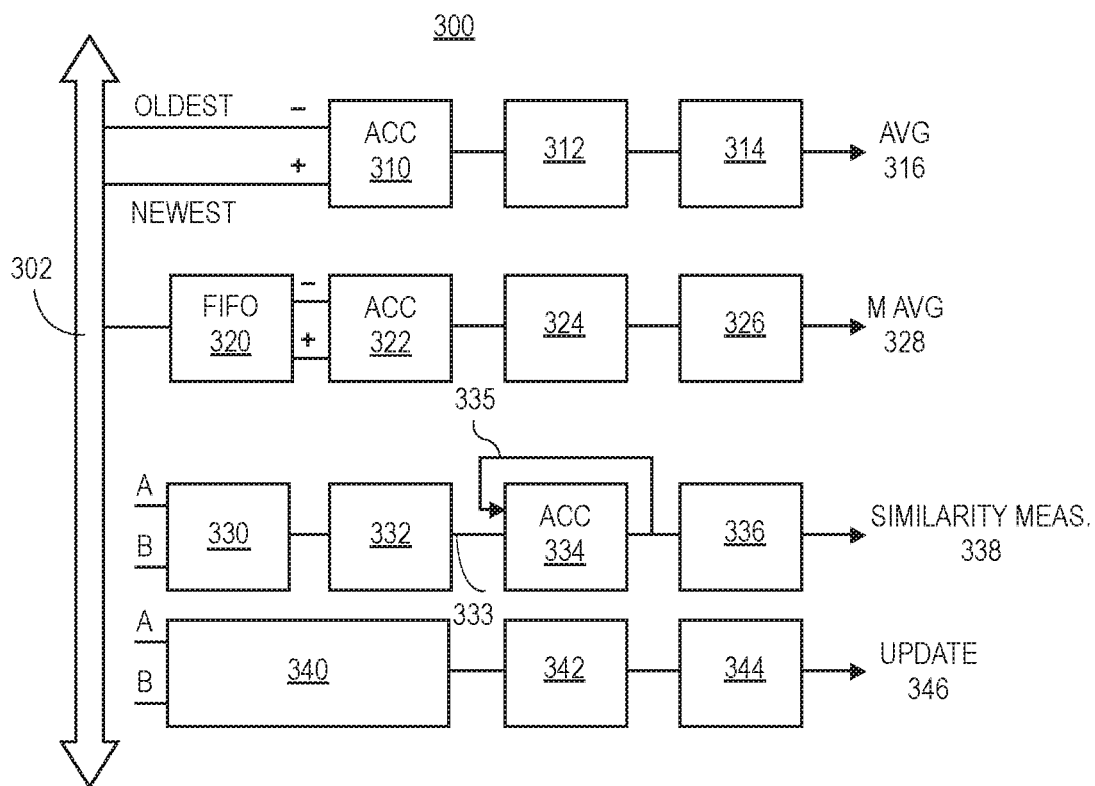
FIG. 3 illustrates a block diagram of smart compute memory circuitry 300 in accordance with one embodiment.

FIG. 3 illustrates a block diagram of smart compute memory circuitry 300 in accordance with one embodiment. The circuitry 300 provides compute functions for processing data locally within a memory subsystem without utilized a host system (e.g., main CPU 1202, processor 1227). The compute functions may include averaging 316, moving average 328, similarity measurement function 338, and update minimum/maximum functionality 346. A data bus 302 provides input to these compute functions. The averaging function 316 is determined using oldest and newest input into an accumulator 310, a divide operation 312, and a register 314 to store output for this averaging function.

The moving averaging function 328 is determined using a buffer 320 (e.g., FIFO buffer), an accumulator 322, a divide operation 324, and a register 326 to store output for this moving averaging function.

The similarity measurement function 338 is determined using input A and B into add/subtract function 330, an absolute value determination 332, an accumulator 334 having an output feedback 335 to be compared with an input 333, and a register 336 to store output for this similarity measurement.

The update minimum/maximum functionality 346 is determined using input A and B into update minimum/maximum function 340, a software applet function 342 (e.g., programming conditional statement, if an alert is determined, then a wakeup signal can be sent to the CPU), and a register 344 to store output for this update minimum/maximum functionality 346.

Figure 4:
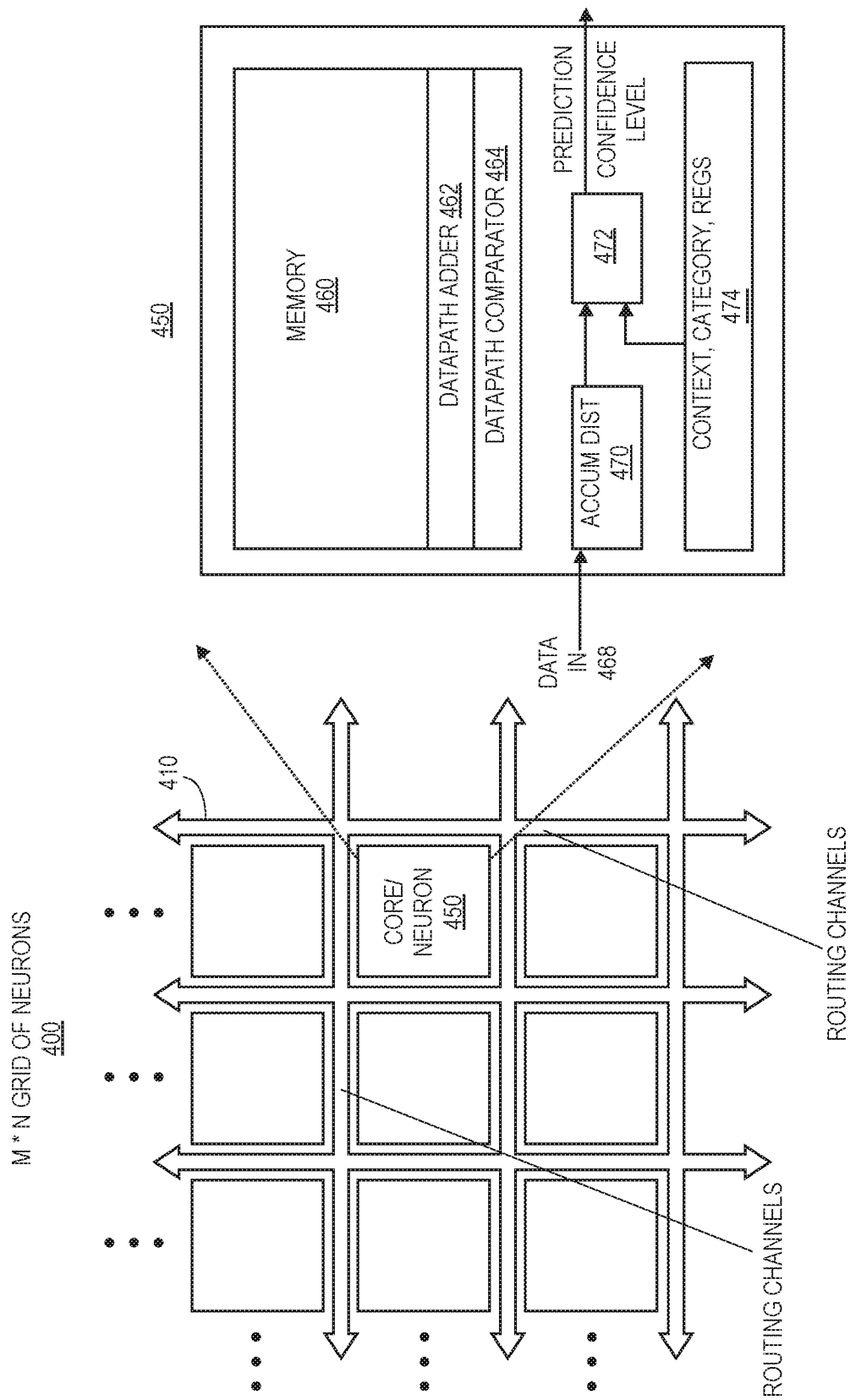
FIG. 4A illustrates low power neuromorphic smart memory 400 in accordance with one embodiment.
FIG. 4B illustrates an exploded view of an IP core in accordance with one embodiment.

FIG. 4A illustrates low power neuromorphic smart memory 400 in accordance with one embodiment. The memory 400 includes a M*N grid of intellectual property (IP) cores 450 that are interconnected with routing channels 410. Each core 450 (e.g., smart compute memory circuitry 150, 200) can be considered to have 100 neurons up to 1 million neurons.

FIG. 4B illustrates an exploded view of an IP core in accordance with one embodiment. The core 450 includes resistive memory 460 to store data (e.g., 2D signals, images, features, etc.), a data path adder 462, and a data path comparator 464. The core 450 has memory, registers, and logic functions (e.g., add/subtract, compare, accumulate 470, software applet logic, etc.) that are similar to smart compute memory circuitry 200 or similar to smart compute memory circuitry 150.

In one example usage flow, neurons are trained with 2D data. For each input test vector (e.g., data 468), neurons compute similarity or distance for data of a context or category 474 with logic 472. A closest neuron match is generated as an output prediction. In one example, pixel values of an input image are compared to pixel values of another image. A neural network can cluster and classify data. Clustering or grouping is the detection of similarities. The clustering may include a search to compare documents, images or sounds to surface similar items.

A classification can detect faces, identify people in images, recognize facial expressions, identify objects in images (stop signs, pedestrians, lane markers . . . ), recognize gestures in video, detect voices, identify speakers, transcribe speech to text, or recognize sentiment in voices. The classification can classify text as spam (in emails), or fraudulent (in insurance claims), or recognize sentiment in text (customer feedback).

In one embodiment, each neuron/IP core, receives 128 to 512 Bytes (1-4 Kbits) of data (e.g., signal, image, feature, etc.). Design automation software enables customization of the number of neurons, neuron memory size, performance, logic functions, and shape.

Figure 5:
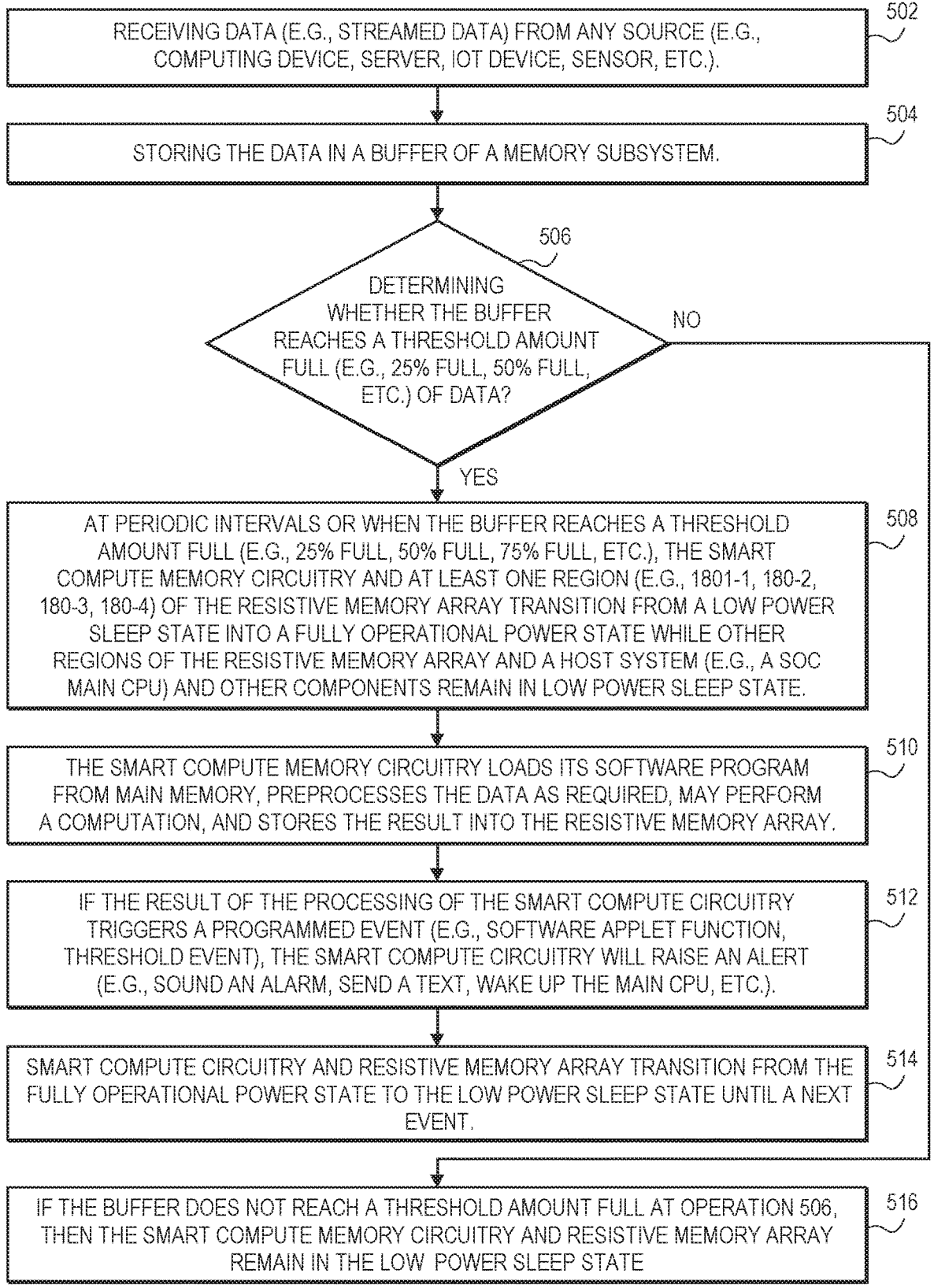
FIG. 5 is a flow diagram illustrating a method 500 for operating a smart compute memory circuitry to reduce power consumption for a computing system in accordance with one embodiment.

FIG. 5 is a flow diagram illustrating a method 500 for operating a smart compute memory circuitry to reduce power consumption for a computing system in accordance with one embodiment. Although the operations in the method 500 are shown in a particular order, the order of the actions can be modified. Thus, the illustrated embodiments can be performed in a different order, and some operations may be performed in parallel. Some of the operations listed in FIG. 5 are optional in accordance with certain embodiments. The numbering of the operations presented is for the sake of clarity and is not intended to prescribe an order of operations in which the various operations must occur. Additionally, operations from the various flows may be utilized in a variety of combinations.

The operations of a computer-implemented method 500 may be executed by a memory subsystem, a smart compute memory circuitry, or an integrated processor. The memory subsystem, a smart compute memory circuitry, or an integrated processor may include hardware (circuitry, dedicated logic, etc.), software (such as is run on a general purpose computer system or a dedicated machine or a device), or a combination of both.

At operation 502, the computer-implemented method includes receiving data (e.g., streamed data) from any source (e.g., computing device, server, IoT device, sensor, etc.). The data can be stored in a buffer of a memory subsystem at operation 504. The computer-implemented method includes determining whether the buffer reaches a threshold amount full (e.g., 25% full, 50% full, 75% full, etc.) of data at operation 506.

At periodic intervals or whenever the buffer is a threshold amount full (e.g., 25% full, 50% full, 75% full, etc.), a smart compute memory circuitry and at least one region (e.g., 1801-1, 180-2, 180-3, 180-4) of the resistive memory array of the memory subsystem transition from a low power sleep state into a fully operational power state while other regions of the resistive memory array 180, a host system (e.g., a SOC main CPU 1202, processor 1227) and other components of the computing system remain in low power sleep state at operation 508.

The smart compute memory circuitry loads its software program from main memory, preprocesses the data as required, may perform a computation, and stores the result into the resistive memory array at operation 510.

Optionally, at operation 512, if the result of the processing of the smart compute circuitry triggers a programmed event (e.g., software applet function, threshold event), the smart compute circuitry will raise an alert (e.g., sound an alarm, send a text, wake up the main CPU, etc.). Then, at operation 514, smart compute circuitry and resistive memory array transition from the fully operational power state to the low power sleep state until a next event occurs.

If the buffer does not reach a threshold amount full at operation 506, then the smart compute memory circuitry and resistive memory array remain in the low power sleep state at operation 516.

The ever increasing size and number of memories in the Systems on Chip has presented the designers and test engineers with a challenge for handling a huge number of functional or automatic test pattern generation (ATPG) patterns for verification of memory functionality. Testing the memory functionality either functionally or through ATPG requires huge test time, and hence, huge test cost. It is difficult in such scenario to verify memory functionality fully. Thus, the designers verify memory functionality through BIST (Built-In Self Test) functionality. BIST is a built-in testing circuitry within a software/hardware module. The test circuitry is initiated from outside of the computing system. This test circuitry, then, runs the built-in patterns/algorithms and returns a response to indicate whether the tested module is working properly.

Most memory devices include various methods for self-test. These methods provide acceleration, unique operating modes, repair accessibility, and trim functions among other capabilities. While these capabilities are very powerful for testing the memory, these capabilities are typically very complicated, difficult to use, and potentially proprietary. As such these capabilities are typically tied off as part of a BIST engine and only usable in very specific, predefined manner.

By implementing the BIST capabilities in this way, the system design benefits from simplicity and any proprietary information is removed, but the result is inflexible and cannot be adopted to meet the testing challenges of varied customers, manufacturers, and years of process variations.

Instead, the present design extends beyond the full capabilities of the BIST and maps the full capabilities to an extended memory space within a resistive memory array. This space is generally outside the normal addressable range, though it does not have to be, and can be read and written to as if it was normal memory space. In this way, any algorithmic unit capable of accessing the memory can also access the full BIST capabilities.

The present design includes an Adaptive Memory Management and Control circuitry (AAMMC) that beyond the BIST enables performing other functions to enable the memory to be optimized both individually and in the SOC that it is integrated in. As such, the AMMC is a superset of the BIST. The AMMC is generally transparent to the SOC user as special mode but certain access can be granted upon request.

In one embodiment, the AMMC provides optimization of parameters including performance, power, and endurance. The AMMC enables adaptively adjusting parameters including performance and power for different operating modes. This could be performed with a calculated and calibrated set of options that change voltage or current to program the memory or change Read and Write times or the Read and Write Profile.

For example, the Write may include a pre-read, write, which could be a single phase or a two phase write. A write logic state 1 may be initially performed and then a write logic state 0 is performed. Then a read verify with varying times for each of the write logic states. A customized sequence may also be adapted for a highest speed by utilizing a write and then read/verify sequence without the pre-read, write.

In another embodiment, the AMCC provides optimization of parameters including Power and Performance over a Temperature Range. Using an integrated Temperature Control circuitry (e.g., circuitry 722 of FIGS. 7-9), the AMMC can adaptively change the power and performance for optimum operating conditions over a given temperature range. At extreme temperature (e.g., below 0 degrees Celsius (C), −40 degrees C.), Read or Write operations may require higher power or exhibit different access times. However, as soon as the IC chip is operating, temperature will quickly rise above 0 degrees C. AMMC enables the optimum performance according to the temperature instead of using the worst case performance at the extreme temperature (e.g., below 0 degrees C., −40 degrees C.).

In another embodiment, AMMC can adaptively enable the Memory to Read and Write from different Banks or regions (e.g., regions 680-1, 680-2, 680-3, 680-4) inside the Memory. This can be used to optimize power by having certain Banks or regions active and other Banks or regions in low power modes (e.g., Sleep mode, Deep Sleep mode, etc.).

The AMCC can also be used to Read and Write to different Banks or regions to improve the performance (e.g., improve performance with a multiplication factor) by using a different Bank or region while the Read or Write operation settles in the initial Bank or region.

Figure 6:
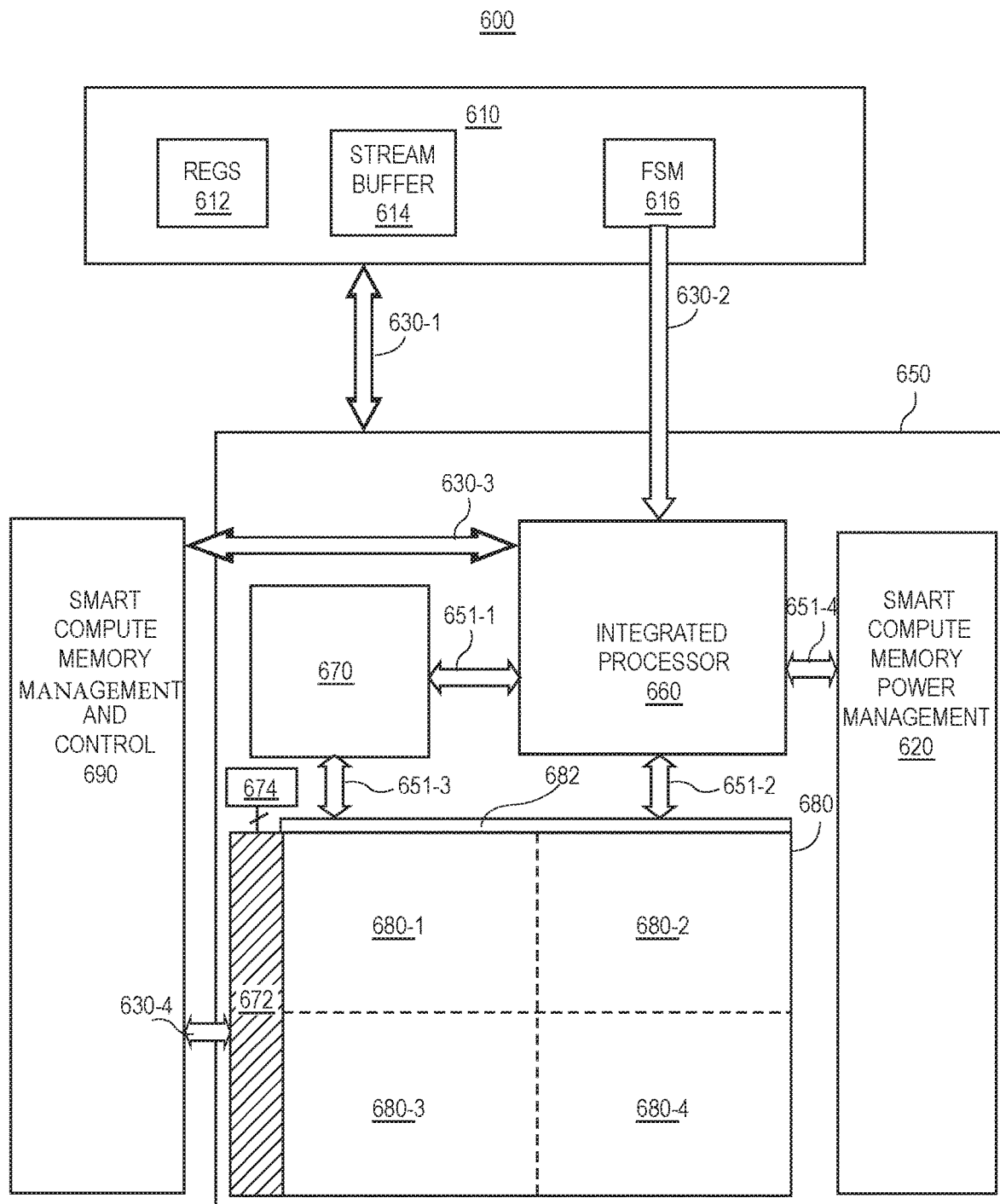
FIG. 6 depicts a block diagram of a memory subsystem 600 with smart compute memory and adaptive memory management and control in accordance with one embodiment

FIG. 6 depicts a block diagram of a memory subsystem 600 with smart compute memory and adaptive memory management and control in accordance with one embodiment. The memory subsystem 600 (e.g., AI subsystem, memory circuitry) includes an input/output (I/O) circuitry 610 having a primarily ON power state to manage input/output of data to the memory subsystem, power management circuitry 620, and smart compute memory circuitry 650 that includes an integrated processor 660 (e.g., processor, microprocessor, microcontroller, risk-V based processor, etc.), a memory interface 670, an Adaptive Memory Management and Control circuitry (AMMC) 672 with extended memory management and control capabilities, a smart compute memory management and control circuitry 690, and a resistive memory array 680. The (I/O) circuitry 610 has the ON power state to receive external input such as data (e.g., streamed data). The AMMC 672 is coupled to an interface 674 to communicate with system components that access AMMC 672. The resistive memory array 680 includes a system interface 682 to communication with the integrated processor 660 and memory interface 670. Alternatively, the memory interface 670 is removed and the system interface 682 communicates with system components.

The resistive memory array 680 can be any type of Non-volatile resistive RAM memory for applications ranging from non-volatile RAM to low-power, high-density SRAM. Example resistance-based memory cells of Non-volatile resistive RAM may include, but are not limited to, Magnetic RAM (MRAM) such as spin-transfer-torque (STT) memory cells, spin-orbit-torque (SOT) memory cells, resistor random access memory (ReRAM, RRAM), phase change RAM (PCRAM), ferro-electric RAM (FeRAM) and/or carbon nanotube memory cells.

This memory subsystem 600 can be a stand-alone chip or embedded as part of a larger SOC. The I/O circuitry 610 includes input stream control registers 612, a memory buffer 614 (e.g., stream FIFO buffer, queue), and a finite state machine 616 to track power states for memory subsystem. Communication links 630-1, 630-2, 630-3, and 630-4 (e.g., high speed interconnects, PCIe) provide communications between the I/O circuitry 610, FSM 616, integrated processor 660, smart compute memory management and control circuitry 690, and smart compute memory circuitry 650. Interconnects connect two or more circuit elements together electrically. The integrated processor 660 can be a low power integrated processor with power-management control. The integrated processor 660 can be used to augment the memory management and control of AMMC 672. Programmable memory management and control enables an optimizing of memory performance (e.g., speed) versus memory endurance (e.g., longer endurance time at lower energy read/write operations causing slower performance versus higher energy (e.g., higher current/voltage) read/write operations causing faster performance and lower endurance). Additionally, the programmable memory management and control of the integrated processor 660 enables management of different modes for writing/reading to enable more usage flexibility. Examples of the different modes include a first mode to manipulate data to encrypt/decrypt the data as needed, a second mode for writing/reading at different speeds to optimize power and performance over a temperature range, a third mode to generate a custom sequence of read and write operations, and a fourth mode to generate a conditional read or write operation based on output from a logic function (e.g., compare, other processing).

The integrated processor 660 is configured to pre/post process data (e.g., streamed data) with results of the pre/post processing being stored in the resistive memory array 680. Communication links 651-1, 651-2, 650-3, and 651-4 provide communications between the memory interface 670, integrated processor 660, power management circuitry 620, and resistive memory array 680. The integrated processor 660 has similar functionality in comparison to the integrated processor 160 of FIG. 1.

In one example, the FSM 616 tracks events and a threshold amount full level of the buffer 614. Upon certain events or a threshold amount full occurring in the buffer 614, then the FSM 616 provides an indicator signal to the power management circuitry 620 to change a power state of the circuitry 650. All of the components within the circuitry 650 can have a modified power state or a subset of components can have a modified power state.

Figure 7:
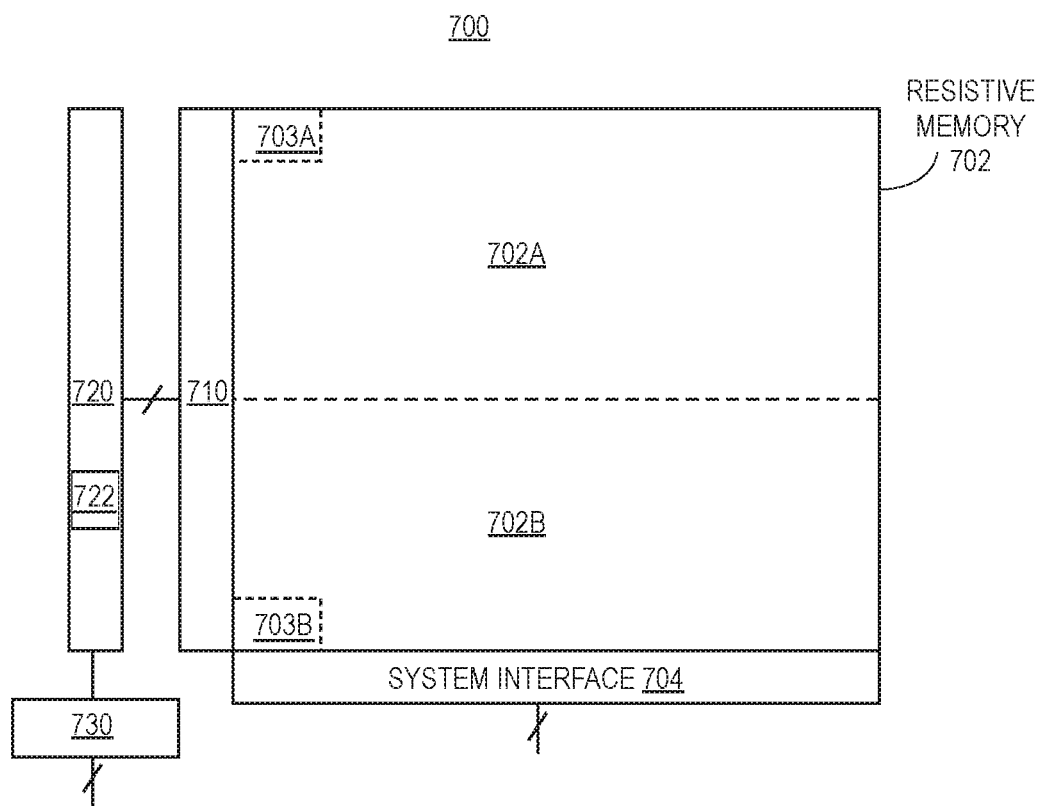
FIG. 7 illustrates a block diagram of a resistive memory having an integrated adaptive memory management and control circuitry (AMMC) in accordance with one embodiment.

FIG. 7 illustrates a block diagram of a resistive memory having an adaptive memory management and control circuitry (AMMC) in accordance with one embodiment. The resistive memory 700 includes a resistive memory array 702, AMMC 720, test logic 710 to control testability features, and an adaptive memory management and control interface 730 to communicate with other components (e.g., integrated processor 160, integrated processor 660). A system interface 704 provides an interface between the resistive memory array 702 and system components (e.g., CPU 1202, processor 1227, integrated processor 160, smart compute circuitry 660). AMMC 720 may include BIST circuitry for the testing of the resistive memory. The BIST circuitry may include BIST hardware including test pattern generators, comparators, and other logic circuitry to optimize the functions above and beyond the flexible integrated processor.

To further enhance the full capabilities of the AMMC 720, a smart compute circuitry (e.g., integrated processor 160, integrated processor 660, microprocessor, microcontroller) and a small amount of writable memory is utilized. An integrated processor can function as a controller for the AMMC 720. The integrated processor can handle complex BIST test sequences in contrast to typical microcontrollers that are limited to 8 or 32 bit test sequences. The AMMC 720 includes a Temperature Control circuitry 722 to sense temperature of memory cells of the resistive memory 702. The temperature control circuitry 722 can be integrated with the AMMC 720 or positioned in close proximity to the resistive memory 702.

In one example, the writable memory of the resistive memory 702 will have the custom test code loaded into the resistive memory and the integrated processor will execute that code. While these components can be external to the memory being tested, for improved results these components will be fully integrated into the memory.

One such implementation would allow the memory to be tested in parts, for example memory region 702A and memory region 702B. When memory region 702A is to be tested, the test code will be loaded into memory 703B of memory region 702B for execution; then when memory region 702B is to be tested, the test code will be loaded into memory 703A of memory region 702A. This would allow for the writable memory requirement to be met without requiring a separate memory, which will increase area and complexity for the memory subsystem.

Figure 8:
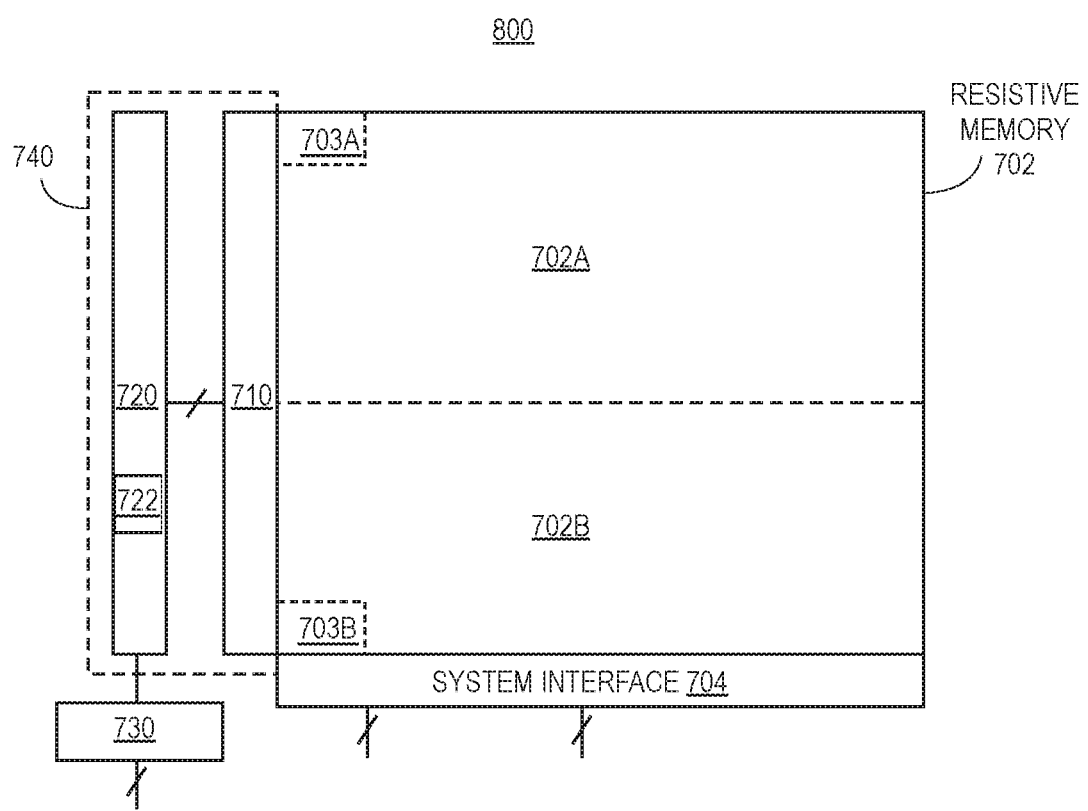
FIG. 8 illustrates a block diagram of a resistive memory having an integrated adaptive memory management and control circuitry (AMMC) in accordance with another embodiment.

FIG. 8 illustrates a block diagram of a resistive memory having an integrated adaptive memory management and control circuitry (AMMC) in accordance with another embodiment. The resistive memory 800 includes a resistive memory array 702, AMMC 720, test logic 710 to control testability features, and an adaptive memory management and control interface 730 to communicate with other components (e.g., integrated processor 160, integrated processor 660).

To further enhance the full capabilities of the AMMC 720, a smart compute circuitry (e.g., integrated processor 160, integrated processor 660, microprocessor, microcontroller) and a small amount of writable memory is utilized. An integrated processor can function as a controller for the AMMC 720. Memory mapped interface(s) 740 are allocated for the AMMC 720 and test logic 710. The memory mapped region is generally outside the normal addressable range, though it does not have to be, and can be read and written to as if it was normal memory space.

Figure 9:
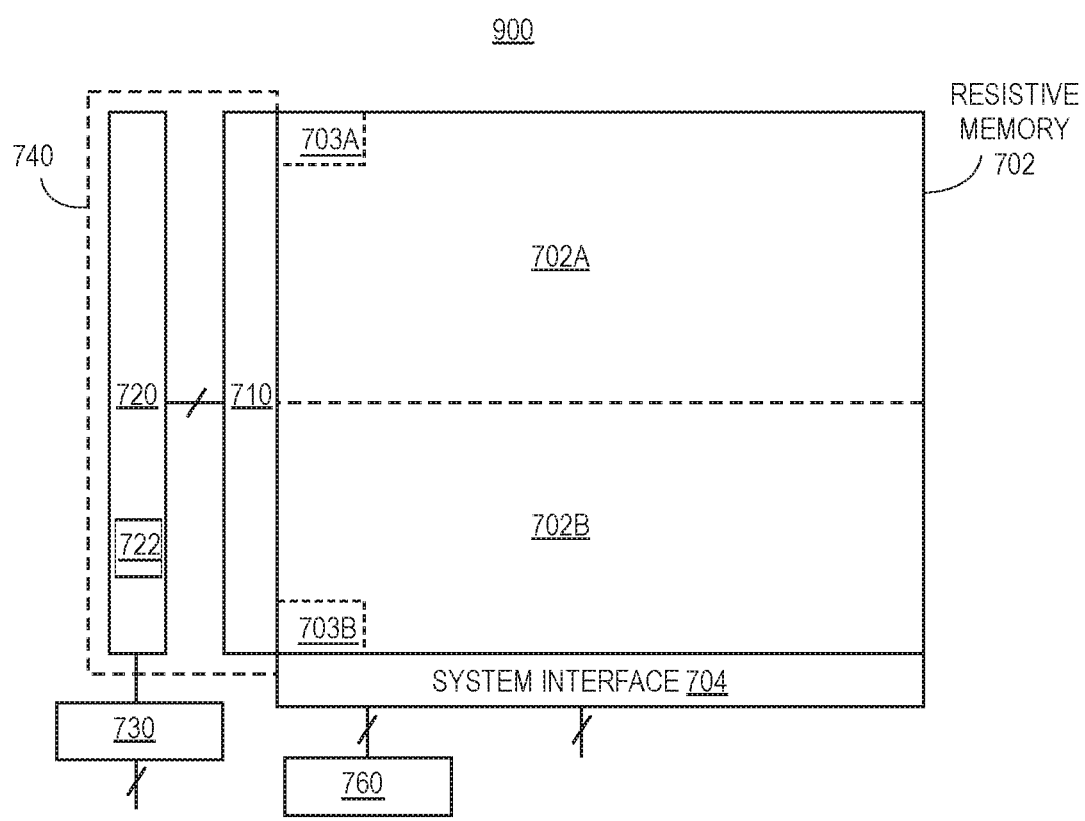
FIG. 9 illustrates a block diagram of a resistive memory having an integrated adaptive memory management and control circuitry (AMMC) in accordance with another embodiment.

FIG. 9 illustrates a block diagram of a resistive memory having an integrated adaptive memory management and control circuitry (AMMC) in accordance with another embodiment. The resistive memory 900 is similar to the resistive memory 800, except that the resistive memory 900 additionally includes a BIST arithmetic logic unit (ALU) 760 that is coupled to the system interface 704. The ALU 760 can be coupled to smart compute circuitry (e.g., integrated processor 160, smart compute circuitry 660) while the system interface 704 can be coupled to other system components.

To further enhance the full capabilities of the AMMC 720, a smart compute circuitry (e.g., integrated processor 160, integrated processor 660, microprocessor, microcontroller) and a small amount of writable memory is utilized. An integrated processor can function as a controller for the AMMC 720. Memory mapped interface(s) 740 are allocated for the AMMC 720 and test logic 710.

Figure 10:
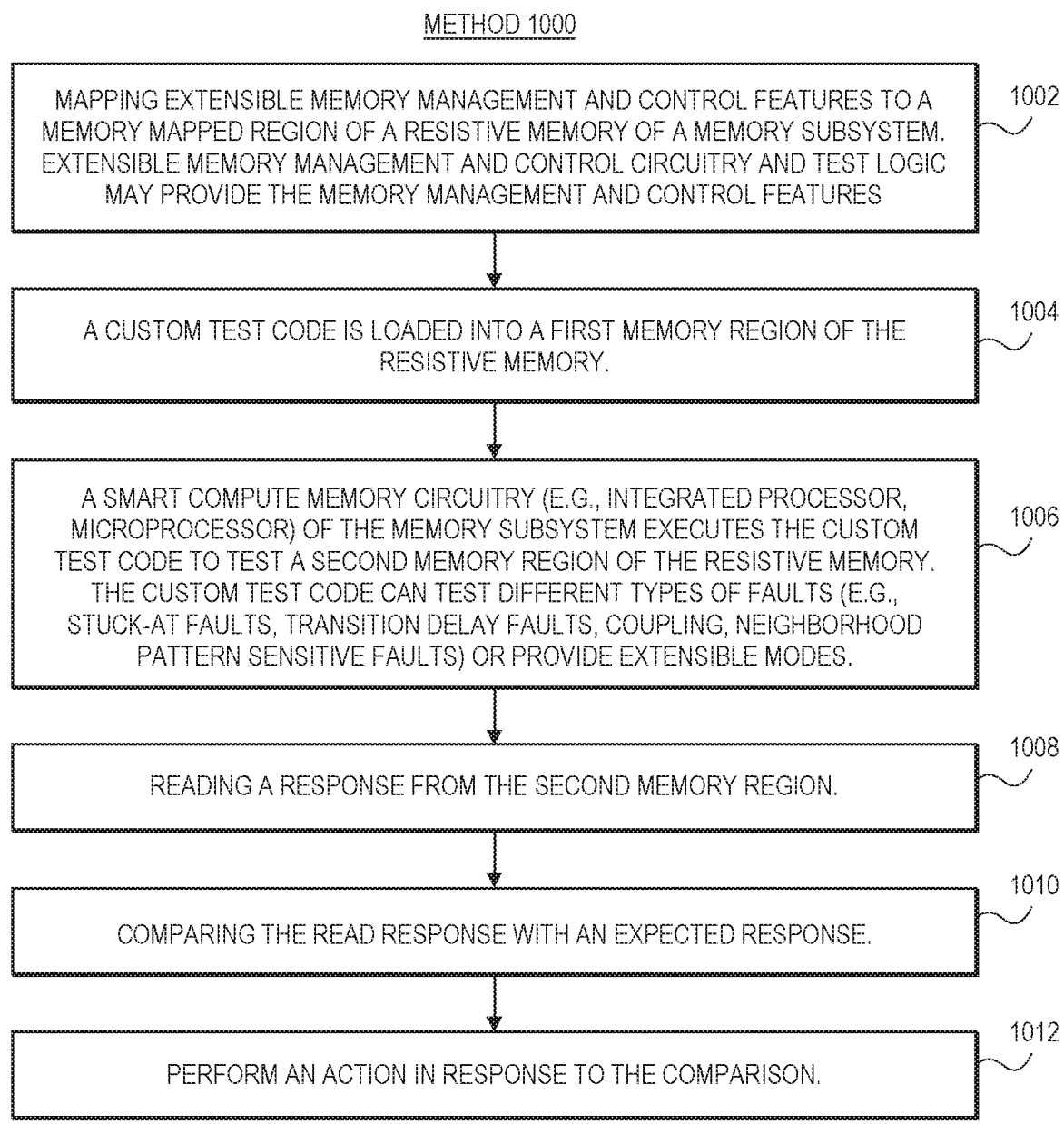
FIG. 10 is a flow diagram illustrating a method 1000 for providing adaptive memory management and control (e.g., extending a BIST for a resistive RAM memory) in accordance with one embodiment.

FIG. 10 is a flow diagram illustrating a method 1000 for providing adaptive memory management, power management, and control in accordance with one embodiment. Although the operations in the method 1000 are shown in a particular order, the order of the actions can be modified. Thus, the illustrated embodiments can be performed in a different order, and some operations may be performed in parallel. Some of the operations listed in FIG. 10 are optional in accordance with certain embodiments. The numbering of the operations presented is for the sake of clarity and is not intended to prescribe an order of operations in which the various operations must occur. Additionally, operations from the various flows may be utilized in a variety of combinations.

The operations of a computer-implemented method 1000 may be executed by a memory subsystem, a smart compute memory circuitry, or an integrated processor. The memory subsystem, a smart compute memory circuitry, or an integrated processor may include hardware (circuitry, dedicated logic, etc.), software (such as is run on a general purpose computer system or a dedicated machine or a device), or a combination of both.

At operation 1002, the computer-implemented method includes mapping adaptive memory management and control features to a memory mapped region of a resistive memory of a memory subsystem. Adaptive memory management and control circuitry and test logic may provide the memory management and control features. This memory mapped region is generally outside the normal addressable range, though it does not have to be, and can be read and written to as if it was normal memory space. In this way, any algorithmic unit capable of accessing the memory can also access the full BIST capabilities.

At operation 1004, a custom test code is loaded into a first memory region of the resistive memory. At operation 1006, a smart compute memory circuitry (e.g., integrated processor, microprocessor) of the memory subsystem executes the custom test code to test a second memory region of the resistive memory. The custom test code can test different types of faults (e.g., stuck-at faults, transition delay faults, coupling, neighborhood pattern sensitive faults) or provide adaptive or enhanced modes.

At operation 1008, the computer-implemented method includes reading a response from the second memory region. At operation 1010, the computer-implemented method includes comparing the read response with an expected response. At operation 1012, the computer-implemented performs an action in response to the comparison. The action may include passing or failing the memory region, optimizing memory performance or endurance, or optimizing power and performance over a temperature range.

The smart compute memory circuitry (e.g., integrated processor, microprocessor) can provide enhanced modes to optimize memory performance/speed versus memory endurance (longer time at lower energy versus higher energy lower endurance). Alternatively, different modes for writing and reading to memory cells can be provided to enable more usage flexibility. In another example, an adaptive mode includes temperature monitoring and memory optimization of the resistive memory array based on temperature. Examples of the different modes include a first mode to manipulate data to encrypt/decrypt the data as needed, a second mode for writing/reading at different speeds to optimize power and performance over a temperature range, a third mode to generate a custom sequence of read and write operations, and a fourth mode to generate a conditional read or write operation based on output from a logic function (e.g., compare, other processing).

Figure 11:
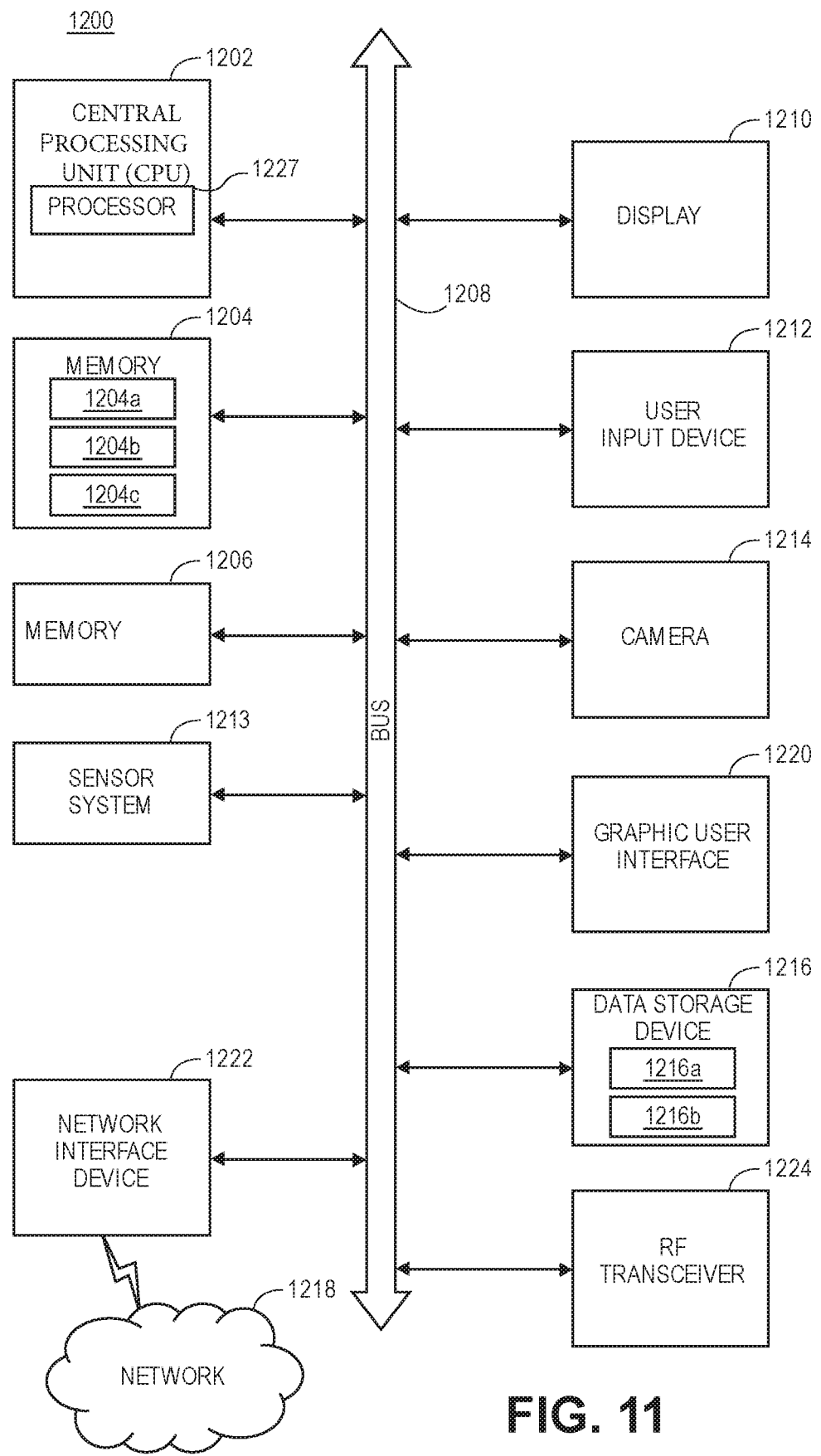
FIG. 11 shows a computer system in accordance with some embodiments described herein.

FIG. 11 is a diagram of a computer system (or computing system) including a data processing system according to an embodiment of the invention. Within the computer system 1200 is a set of instructions for causing the machine to perform any one or more of the methodologies discussed herein. In alternative embodiments, the machine may be connected (e.g., networked) to other machines in a LAN, an intranet, an extranet, or the Internet. The machine can operate in the capacity of a server or a client in a client-server network environment, or as a peer machine in a peer-to-peer (or distributed) network environment, the machine can also operate in the capacity of a web appliance, a server, a network router, switch or bridge, event producer, distributed node, centralized system, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

Data processing system 1202 (or CPU 1202), as disclosed above, includes a general purpose instruction-based processor 1227. The general purpose instruction-based processor may be one or more general purpose instruction-based processors or processing devices (e.g., microprocessor, central processing unit (CPU), or the like). More particularly, data processing system 1202 may be a complex instruction set computing (CISC) microprocessor, reduced instruction set computing (RISC) microprocessor, very long instruction word (VLIW) microprocessor, general purpose instruction-based processor implementing other instruction sets, or general purpose instruction-based processors implementing a combination of instruction sets.

The exemplary computer system 1200 (or wireless device 1200 such as mobile device, tablet device, smart watch, etc.) includes a data processing system 1202 (or CPU 1202), a main memory 1206 (e.g., read-only memory (ROM), flash memory, dynamic random access memory (DRAM) such as synchronous DRAM (SDRAM) or DRAM (RDRAM), etc.), a Non-volatile resistive RAM memory 1204 (e.g., resistance-based memory cells may include, but are not limited to, Magnetic RAM (MRAM) such as spin-transfer-torque (STT) memory cells, spin-orbit-torque (SOT) memory cells, resistor random access memory (ReRAM, RRAM), phase change RAM (PCRAM), ferro-electric RAM (FeRAM) and/or carbon nanotube memory cells, etc.) and a data storage device 1216 (e.g., a secondary memory unit in the form of a drive unit, which may include fixed or removable computer-readable storage medium), which communicate with each other via a bus 1208. The storage units and memory disclosed in computer system 1200 may be configured to implement the data storing mechanisms for performing the operations and steps discussed herein.

In one embodiment, the data storage device 1216 includes storage region 1216a and smart compute circuitry 1216b. The present design reduces latency and improves performance in Enterprise Storage Drives by utilizing the smart compute circuitry 1216b (e.g., integrated processor, microprocessor, microcontroller, etc.) to perform some processing and computation operations native to the data storage device 1216 instead of sending data from the data storage device to interconnect to the bus 1208 to additional interconnect to the host system (e.g., CPU 1202) and then having the host system perform the operations or computations, and then send the processed data to the interconnect to the bus 1208 to additional interconnect to the data storage device 1216. In one example, database compare/matching operations are performed to determine whether a database should be stored in a data storage device for local processing or whether the database should be moved to a different location for processing.

Memory 1206 can store code and/or data for use by processor 1227. Memory 1206 includes a memory hierarchy that can be implemented using any combination of RAM (e.g., SRAM, DRAM, DDRAM), ROM, FLASH, magnetic and/or optical storage devices. Memory may also include a transmission medium for carrying information-bearing signals indicative of computer instructions or data (with or without a carrier wave upon which the signals are modulated).

The memory 1204 can be a memory subsystem (e.g., 100, 600) as discussed herein. The memory 1204 can include any of the components of the memory subsystem such as I/O circuitry 1204a, smart compute memory circuitry 1204b, and resistive memory array 1204c.

Processor 1227 and smart compute memory circuitry 1204b execute various software components stored in memory to perform various functions for system 1200. In one embodiment, the software components include an operating system, compiler component, and communication module (or set of instructions). Furthermore, memory may store additional modules and data structures not described above.

Operating system includes various procedures, sets of instructions, software components and/or drivers for controlling and managing general system tasks and facilitates communication between various hardware and software components. A compiler is a computer program (or set of programs) that transform source code written in a programming language into another computer language (e.g., target language, object code). A communication module provides communication with other devices utilizing the network interface device 1222 or RF transceiver 1224. The network interface device 1222 is coupled with a network 1218 (e.g., local area network (LAN), wide area network (WAN)) to communicate with other devices.

The computer system 1200 may further include a network interface device 1222. The computer system 1200 also may include an optional display device 1210 (e.g., a liquid crystal display (LCD), LED, or a cathode ray tube (CRT)) connected to the computer system through a graphics port and graphics chipset, an optional input device 1212 (e.g., a keyboard, a mouse), a sensor system 1213, a camera 1214. In another example, the computer system is a wireless device 1200 (e.g., mobile device, tablet device, smart watch, etc.) that includes an optional Graphic User Interface (GUI) device 1220 (e.g., a touch-screen with input & output functionality).

The computer system 1200 may further include a RF transceiver 1224 that provides frequency shifting, converting received RF signals to baseband and converting baseband transmit signals to RF. In some descriptions a radio transceiver or RF transceiver may be understood to include other signal processing functionality such as modulation/demodulation, coding/decoding, interleaving/de-interleaving, spreading/dispreading, inverse fast Fourier transforming (IFFT)/fast Fourier transforming (FFT), cyclic prefix appending/removal, and other signal processing functions.

The data storage device 1216 may include a machine-readable storage medium (or more specifically a computer-readable storage medium) on which is stored one or more sets of instructions embodying any one or more of the methodologies or functions described herein. Disclosed data storing mechanism may be implemented, completely or at least partially, within the main memory 1206 and/or within the data processing system 1202 by the computer system 1200, the main memory 1206 and the data processing system 1202 also constituting machine-readable storage media.

In one example, the computer system 1200 is an autonomous vehicle that may be connected (e.g., networked) to other machines or other autonomous vehicles in a LAN, WAN, or any network. The autonomous vehicle can be a distributed system that includes many computers networked within the vehicle. The autonomous vehicle can operate in the capacity of a server or a client in a client-server network environment, or as a peer machine in a peer-to-peer (or distributed) network environment. The storage units disclosed in computer system 1200 may be configured to implement data storing mechanisms for performing the operations of autonomous vehicles.

Figure 12:
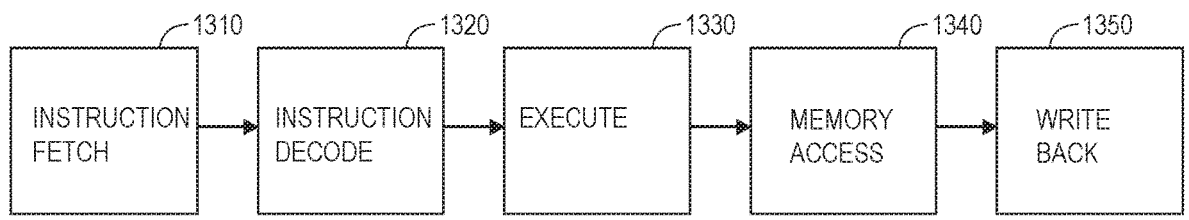
FIG. 12 illustrates a flow diagram of operational stages of an integrated processor (e.g., RISC, smart compute circuitry) in accordance with one embodiment.

FIG. 12 illustrates a flow diagram 1300 of operational stages of a processor (e.g., RISC, smart compute circuitry, integrated processor) in accordance with one embodiment. In one example, at stage 1310, the processor initially fetches an instruction from memory (e.g., resistive memory array 180, memory 1204, memory 1206). At stage 1320, the instruction is then decoded to determine what action may then be performed. Based on the instruction the processor fetches, if required, data from memory or an I/O module.

At stage 1330, the instruction is then executed which may require performing arithmetic or logical operations on the data. In addition to execution, the processor also supervises and controls I/O devices or I/O modules (e.g., I/O circuitry 110, input device 1212, GUI 1220). If there is any request from I/O devices or I/O modules, called interrupt, the processor suspends execution of the current programs and transfers control to an interrupt handling program. The results of an execution may require a memory access at stage 1340 to transfer data to the memory, I/O device, or an I/O Module. At stage 1350, the processor performs a write back policy with the data being written to registers of the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The bus may also link various other circuits such as timing sources, peripherals, voltage regulators, power management circuits, and the like, which are well known in the art, and therefore, will not be described any further.

Any of the following examples can be combined into a single embodiment or these examples can be separate embodiments. In one example of a first embodiment, a smart compute memory circuitry comprises an integrated processor and logic circuitry to enable adaptive power or performance improvements, and adaptive memory management and control for the smart compute memory circuitry. A resistive memory array is coupled to the integrated processor.

In another example of the first embodiment, the resistive memory array comprises non-volatile random access memory (RAM) including one or more of Magnetic RAM (MRAM), resistor random access memory (ReRAM, RRAM), phase change RAM (PCRAM), ferro-electric RAM (FeRAM) and/or carbon nanotube memory cells.

In another example of the first embodiment, the integrated processor is configured with programmable memory management and control to optimize parameters including memory performance and memory endurance.

In another example of the first embodiment, the integrated processor is configured to preprocess incoming stream data with results of the preprocessing being stored in the resistive memory array while a host system remains in a low power sleep state.

In another example of the first embodiment, the integrated processor is configured to post process data to be output from the resistive memory array while a host system remains in a low power sleep state.

In another example of the first embodiment, the integrated processor is configured with power management control to control power states including a normal operational state and a sleep state of the integrated processor and the resistive memory array.

In one example of a second embodiment, a computing system comprises a central processing unit (CPU) and a memory subsystem coupled to the CPU. The memory subsystem includes input/output (I/O) circuitry, a smart compute memory circuitry, and a resistive memory array. The smart compute memory circuitry includes an integrated processor and logic circuitry to enable adaptive power or performance improvements, and adaptive memory management and control for the smart compute memory circuitry.

In another example of the second embodiment, the resistive memory array comprises non-volatile random access memory (RAM) including one or more of Magnetic RAM (MRAM), resistor random access memory (ReRAM, RRAM), phase change RAM (PCRAM), ferro-electric RAM (FeRAM) and/or carbon nanotube memory cells.

In another example of the second embodiment, the integrated processor is configured with programmable memory management and control to optimize parameters including memory performance and memory endurance.

In another example of the second embodiment, the integrated processor is configured to preprocess streamed data with results of the preprocessing being stored in the resistive memory array while the CPU remains in a low power sleep state.

In another example of the second embodiment, the integrated processor is configured to post process data to be output from the resistive memory array while the CPU remains in a low power sleep state.

In another example of the second embodiment, the integrated processor is configured with power management control to control power states including a normal operational state and a sleep state of the integrated processor and the resistive memory array.

In another example of the second embodiment, the I/O circuitry has a power ON state and no low power state.

In another example of the second embodiment, the computing system further comprises power management circuitry coupled to the I/O circuitry. The power management circuitry to receive input from a finite state machine of the I/O circuitry and to control power states for the integrated processor and resistive memory.

In one example of a third embodiment, a computer-implemented method for low power operations of a computing system comprises receiving, with a memory subsystem of the computing system, data from any source, storing the data in a buffer of the memory subsystem, determining when the buffer reaches a threshold amount full of data, and transitioning a smart compute circuitry and at least one region of a resistive memory array of the memory subsystem from a low power sleep state to an operational power state at periodic intervals or when the buffer reaches the threshold amount full.

In another example of the third embodiment, the smart compute circuitry and at least one region of the resistive memory array transition from the low power sleep state to the operational power state while other regions of the resistive memory array and components of the computing system including a main CPU remain in the low power sleep state.

In another example of the third embodiment, the computer-implemented method further comprises loading, with the smart compute circuitry, a software program, processing, with the smart compute circuitry, the data to generate a result, and storing the result into the resistive memory array.

In another example of the third embodiment, the computer-implemented method further comprises determining whether the processing of the smart compute circuitry triggers a programmed event and responding to the programmed event to transition the main CPU from the low power sleep state to an operational state.

In another example of the third embodiment, the computer-implemented method further comprises transitioning the smart compute circuitry to the low power sleep state until a next event in response to the main CPU transitioning to the operational state.

In another example of the third embodiment the smart compute circuitry comprises an integrated processor and the resistive memory array comprises non-volatile random access memory (RAM) including one or more of Magnetic RAM (MRAM), resistor random access memory (ReRAM, RRAM), phase change RAM (PCRAM), ferro-electric RAM (FeRAM) and/or carbon nanotube memory cells.

In one example of a fourth embodiment, a resistive memory includes a resistive memory array and an adaptive Memory Management and Control circuitry (AMMC) coupled to the resistive memory array. The AMMC is configured with extended test, reliability, performance, or power optimizing capabilities.

In another example of the fourth embodiment, the AMMC is integrated with the resistive memory array.

In another example of the fourth embodiment, the AMMC is configured with performance optimizing capabilities to optimize memory speed with reduced memory endurance or to optimize memory endurance with reduced memory speed.

In another example of the fourth embodiment, the resistive memory further comprises a memory mapped interface to map adaptive memory management and control features to a memory mapped region of the resistive memory.

In another example of the fourth embodiment, the AMMC includes built-in self test circuitry to test functionality of the resistive memory array that is extended to additional testing functions.

In another example of the fourth embodiment, the resistive memory array comprises non-volatile random access memory (RAM) including one or more of magnetic RAM (MRAM), resistive RAM (RRAM), phase-change RAM (PCRAM), or Ferroelectric RAM (FeRAM).

In one example of a fifth embodiment, a memory subsystem includes a smart compute memory circuitry, a resistive memory array coupled to the smart compute memory circuitry and an Adaptive Memory Management and Control circuitry (AMMC) coupled to the resistive memory array. The AMMC is configured with extended test and performance optimizing capabilities.

In another example of the fifth embodiment, the smart compute memory circuitry comprises an integrated processor with power-management control and memory management control.

In another example of the fifth embodiment, the integrated processor is configured with programmable memory management and control to optimize parameters with different modes including a first mode to manipulate data to encrypt or decrypt the data as needed, a second mode for writing or reading at different speeds to optimize power and performance over a temperature range, a third mode to generate a custom sequence of read and write operations, and a fourth mode to generate a conditional read or write operation based on output from a logic function.

In another example of the fifth embodiment, the AMMC comprises an integrated temperature control circuitry to sense temperature, wherein the AMMC is configured to adaptively change power and performance over a temperature range based on sensed temperature data of the resistive memory array using the integrated temperature control circuitry.

In another example of the fifth embodiment, the AMMC includes built-in self test (BIST) circuitry to test functionality of the resistive memory array.

In another example of the fifth embodiment, the integrated processor is configured to execute test code for the BIST circuitry with the test code being stored in a first region of the resistive memory array while a second region of the resistive memory array is being tested.

In another example of the fifth embodiment, the AMMC to adaptively enable optimization of power by reading and writing to a first region of the resistive memory array while operating a second region of the resistive memory array in a low power mode.

In another example of the fifth embodiment, the resistive memory array comprises non-volatile random access memory (RAM) including one or more of magnetic RAM (MRAM), resistive RAM (RRAM), phase-change RAM (PCRAM), or Ferroelectric RAM (FeRAM).

In one example of a sixth embodiment, a computer-implemented method provides adaptive memory management and control to a resistive memory. The computer-implemented method comprises mapping adaptive memory management and control features to a memory mapped region of the resistive memory of a memory subsystem, loading a custom test code into a first memory region of the resistive memory, and executing, with a smart compute memory circuitry of the memory subsystem, the custom test code to test a second memory region of the resistive memory.

In another example of the sixth embodiment, the custom test code tests different types of faults or provides adaptive modes to improve reliability, performance, endurance, or power consumption of the resistive memory.

In another example of the sixth embodiment, the computer-implemented method further comprises reading a response from the second memory region, comparing the read response with an expected response, and performing an action in response to the comparison.

In another example of the sixth embodiment, the action includes passing or failing the memory region or optimizing memory settings, performance, endurance, or power.

In another example of the sixth embodiment, the smart compute memory circuitry comprises an integrated processor that is configured to provide different modes for writing and reading to memory cells of the resistive memory to enable more usage flexibility. The different modes include a performance optimization mode to improve performance by reading from or writing to multiple memory banks of the resistive memory either sequentially or with a set addressing sequence enabling for example to read from or write to a second memory bank while the read or write settles in the first memory bank of the resistive memory.

In another example of the sixth embodiment, the resistive memory comprises non-volatile random access memory (RAM) including one or more of magnetic RAM (MRAM), resistive RAM (RRAM), phase-change RAM (PCRAM), or Ferroelectric RAM (FeRAM).

It is to be understood that the claims are not limited to the precise configuration and components illustrated above. Various modifications, changes and variations may be made in the arrangement, operation and details of the methods and apparatus described above without departing from the scope of the claims.

What is claimed is:
1. Resistive memory comprising:
a resistive memory array; and
an adaptive Memory Management and Control circuitry (AMMC) coupled to the resistive memory array, wherein the AMMC is configured with extended test, reliability, performance or power optimizing capabilities, wherein the AMMC is configured with the performance optimizing capabilities to optimize memory speed with reduced memory endurance or to optimize memory endurance with reduced memory speed.

2. The resistive memory of claim 1, wherein the AMMC is integrated with the resistive memory array.

3. The resistive memory of claim 1, wherein the AMMC is configured with performance optimizing capabilities and power optimizing capabilities.

4. The resistive memory of claim 1, further comprising:
a memory mapped interface to map adaptive memory management and control features to a memory mapped region of the resistive memory.

5. The resistive memory of claim 1, wherein the AMMC includes built-in self test circuitry to test functionality of the resistive memory array that is extended to additional testing functions.

6. The resistive memory of claim 1, wherein the resistive memory array comprises non-volatile random access memory (RAM) including one or more of magnetic RAM (MRAM), resistive RAM (RRAM), phase-change RAM (PCRAM), or Ferroelectric RAM (FeRAM).

7. A memory subsystem comprising:
a smart compute memory circuitry;
a resistive memory array coupled to the smart compute memory circuitry; and
an Adaptive Memory Management and Control circuitry (AMMC) coupled to the resistive memory array, wherein the AMMC is configured with extended test and performance optimizing capabilities, wherein the smart compute memory circuitry comprises an integrated processor with power-management control and memory management control.

8. The memory subsystem of claim 7, wherein the smart compute memory circuitry comprises an integrated processor with power-management control and memory management control to augment memory management and control of the AMMC.

9. The memory subsystem of claim 7, wherein the integrated processor is configured with programmable memory management and control to optimize parameters with different modes including a first mode to manipulate data to encrypt or decrypt the data as needed, a second mode for writing or reading at different speeds to optimize power and performance over a temperature range, a third mode to generate a custom sequence of read and write operations, and a fourth mode to generate a conditional read or write operation based on output from a logic function.

10. The memory subsystem of claim 7, wherein the AMMC comprises an integrated temperature control circuitry to sense temperature, wherein the AMMC is configured to adaptively change power and performance over a temperature range based on sensed temperature data of the resistive memory array using the integrated temperature control circuitry.

11. The memory subsystem of claim 7, wherein the AMMC includes built-in self test (BIST) circuitry to test functionality of the resistive memory array.

12. The memory subsystem of claim 9, wherein the integrated processor is configured to execute test code for the BIST circuitry with the test code being stored in a first region of the resistive memory array while a second region of the resistive memory array is being tested.

13. The memory subsystem of claim 11, wherein the AMMC to adaptively enable optimization of power by reading and writing to a first region of the resistive memory array while operating a second region of the resistive memory array in a low power mode.

14. The computing system of claim 7, wherein the resistive memory array comprises non-volatile random access memory (RAM) including one or more of magnetic RAM (MRAM), resistive RAM (RRAM), phase-change RAM (PCRAM), or Ferroelectric RAM (FeRAM).

* * * * *